(12) United States Patent
Geh et al.

(10) Patent No.: US 7,198,873 B2
(45) Date of Patent: Apr. 3, 2007

(54) LITHOGRAPHIC PROCESSING OPTIMIZATION BASED ON HYPERSAMPLED CORRELATIONS

(75) Inventors: Bernd Geh, Scottsdale, AZ (US);
Roger Henry Irwin, Phoenix, AZ (US);
Eric Anthony Janda, Chandler, AZ (US); David Merritt Phillips, Corrales, NM (US)

(73) Assignee: ASML Netherlands B.V., Veldhoven (NL)

( * ) Notice: Subject to any disclaimer, the term of this patent is extended or adjusted under 35 U.S.C. 154(b) by 471 days.

(21) Appl. No.: 10/715,109

(22) Filed: Nov. 18, 2003

(65) Prior Publication Data

US 2005/0106479 A1 May 19, 2005

(51) Int. Cl.
*G03F 9/00* (2006.01)
*G03C 5/00* (2006.01)

(52) U.S. Cl. .......................................... 430/30; 355/77
(58) Field of Classification Search ................ 430/30; 355/77
See application file for complete search history.

(56) References Cited

U.S. PATENT DOCUMENTS

| | | | |
|---|---|---|---|
| 6,678,240 B2 * | 1/2004 | Geh et al. ..................... | 355/77 |
| 6,716,648 B2 | 4/2004 | Iriki | |
| 6,873,938 B1 | 3/2005 | Paxton et al. | |
| 6,934,011 B2 * | 8/2005 | Geh et al. ..................... | 355/77 |

OTHER PUBLICATIONS

Flagello, Donis G.; van der Laan, Hans; van Schoot, Jan; Bouchoms, Igor; and Geh, Bernd, "Understanding systematic and random cd variations using predicitive modelling techniques," SPIE Conference on Optical Microlithography XII, Mar. 1999, pp. 162-175, vol. 3679, Santa Clara, California.

* cited by examiner

*Primary Examiner*—Christopher G. Young
(74) *Attorney, Agent, or Firm*—Pillsbury Winthrop Shaw Pittman, LLP

(57) ABSTRACT

A method of optimizing lithographic processing to achieve substrate uniformity, is presented herein. In one embodiment, The method includes deriving hyper-sampled correlation information indicative of photoresist behavior for a plurality of wafer substrates processed at pre-specified target processing conditions. The derivation includes micro-exposing subfields of the substrates with a pattern, processing the substrates at the various target conditions, determining photoresist-related characteristics of the subfields (e.g., Bossung curvatures), and extracting correlation information regarding the subfield characteristics and the different target processing conditions to relate the target conditions as a function of subfield characteristics. The method then detects non-uniformities in a micro-exposed subsequent substrate-processed under production-level processing conditions and exploits the correlation information to adjust the production-level conditions and achieve uniformity across the substrate.

27 Claims, 5 Drawing Sheets

FIG. 3D
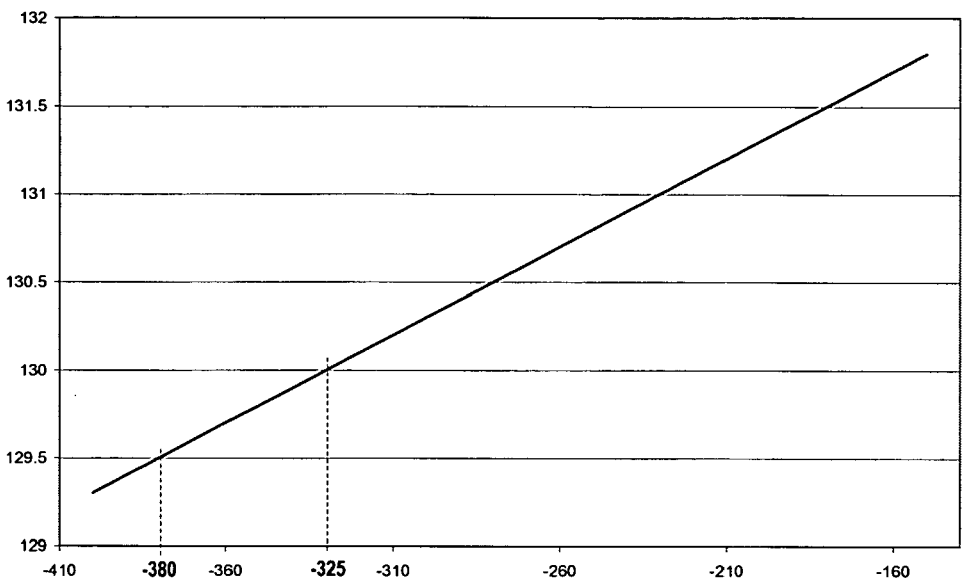
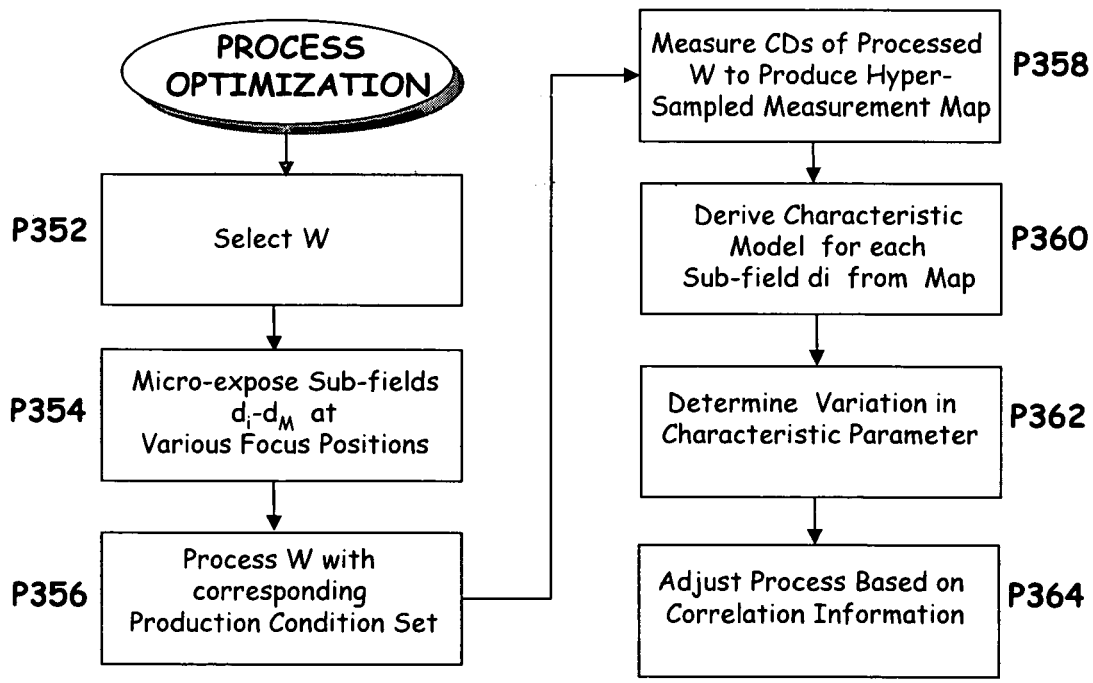
FIG. 3E

LITHOGRAPHIC PROCESSING OPTIMIZATION BASED ON HYPERSAMPLED CORRELATIONS

BACKGROUND OF THE INVENTION

1. Field of the Invention

The present invention generally relates to lithographic systems and apparatuses and, more particularly, to lithographic exposure processes.

2. Description of the Related Art

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of photo-sensitive material (resist).

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus—commonly referred to as a wafer stepper—each target portion is irradiated by exposing the entire mask pattern onto the target portion in one go. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, the pattern is imaged onto a substrate that is at least partially covered by a layer of photo-sensitive material (i.e., resist or photoresist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are, then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Needless to say, it is important that the features and profile of the pattern exposed on the target fields of the wafer substrate are replicated as accurately as possible. To this end, manufacturers normally specify the critical dimension (CD) of the exposed pattern in order to characterize the features and profile of the pattern and establish a benchmark level of quality and uniformity. Another important consideration is the ability to manipulate the lithographic fabrication process to repeatedly and increasingly yield high-quality substrate wafers.

There are, however, numerous activities during the lithographic fabrication process that affect the critical dimension uniformity (CDU) and compromise the quality of the exposed patterns. Such non-uniformities may occur across a target field, across a wafer, and between wafers. Indeed, some of the very pre- and post-exposure processes that service and treat the substrate wafers may contribute to variations in the CDU.

For example, as noted above, wafer substrates are usually coated with photoresist prior to lithographic exposure and the prevailing conditions employed by the post-exposure processes, such as, post-exposure bake (PEB) temperatures, can have deleterious effect on the characteristics and performance of the photoresist. This, in turn, compromises CD quality.

In an effort to reduce non-uniformities due to PEB temperature, various attempts have included the use of temperature sensing devices, such as thermo-couplers, resistance temperature detectors, wireless sensors, to detect thermal variations in the PEB and compensate for such variations by adjusting the PEB thermal zones. However, because these temperature sensing devices are macroscopic relative to the substrate target fields and they require additional hardware, their accuracy may be compromised as the extra mass and size can adversely influence the thermal behavior of the PEB plate. Also, some of these temperature sensing devices can only be employed with special test wafer substrates, which may have different properties than production level wafer substrates.

Moreover, because of the limited number of temperature sensing devices that can be coupled to a 300 mm wafer substrate or larger, there may be insufficient spatial resolution to render precise measurements. Finally, using temperature measurements as a basis to determine photoresist response is, at best, an indirect method of achieving satisfactory CD performance.

SUMMARY OF THE INVENTION

Systems and apparatuses consistent with the principles of the present invention, as embodied and broadly described herein, provide for optimizing lithographic processes to achieve substrate uniformity. In one embodiment, the method includes deriving correlation information indicative of photoresist behavior, which comprises exposing a pattern onto a plurality of subfields of a plurality of substrates such that, for each of the substrates, the subfields are repeatedly exposed with the pattern at different focal positions of a lithographic exposure apparatus, processing each of the substrates at different target processing conditions, measuring attributes of each of the subfields, determining a characteristic for each of the subfields based on the measured attributes such that the characteristic represents photoresist behavior, and extracting correlation information regarding the subfield characteristics and the different target processing conditions.

The method then detects non-uniformities in a subsequent substrate by exposing the pattern onto a plurality of subfields of the subsequent substrate such that the subfields are repeatedly exposed with the pattern at different focal positions of said lithographic exposure apparatus, processes the subsequent substrate at a production processing condition, measures attributes of the subfields within the processed subsequent substrate, determines the characteristic for each of the subfields within the processed subsequent substrate based on the measured attributes, and identifies differences among the subfield characteristics of the processed subsequent substrate. The method then adjusts the production processing condition based on the correlation information.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion/target field", respectively. Also, NOT ONLY LIMITED TO PEB Temperatures.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIGS. 3B–3D are schematic diagrams depicting various attributes of an embodiment of the present invention; and FIG. 3E is a schematic functional flow diagram depicting an embodiment of the present invention.

In the figures, corresponding reference symbols indicate corresponding parts.

DETAILED DESCRIPTION

As noted above, processes that treat the wafer substrates may contribute to variations in CDU that negatively affect the quality and performance of the exposed patterns on the substrate. Such non-uniformities may occur across a target field, across a wafer, and between wafers.

As described in greater detail below, the present invention contemplates optimizing lithographic processes to achieve substrate uniformity. The method includes deriving hyper-sampled correlation information indicative of photoresist behavior for a plurality of wafer substrates processed at pre-specified target processing conditions. The method then detects non-uniformities in a subsequent substrate processed under production-level processing condition and exploits the correlation information to adjust the production-level condition and achieve uniformity across the substrate.

Figure 1:
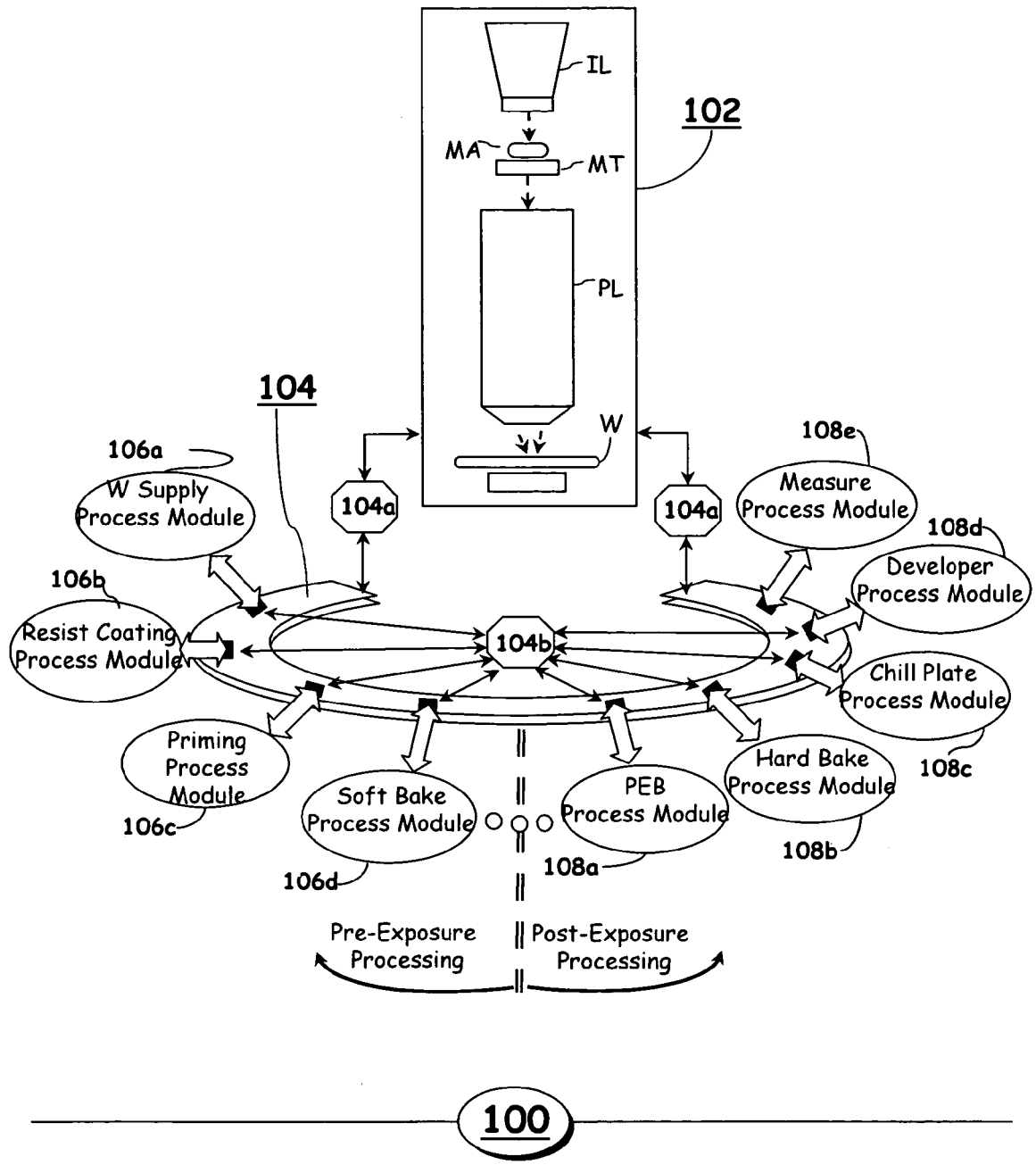
FIG. 1 is a schematic illustration of a photolithographic exposure apparatus and wafer track apparatus.

FIG. 1 schematically depicts lithographic system 100 according to a particular embodiment of the invention. System 100 comprises lithographic exposure apparatus 102, which is configured to expose a pattern onto a substrate wafer, and wafer track apparatus 104, which is configured to transport the substrate wafers between the various pre- and post-exposure processing modules.

Figure 2:
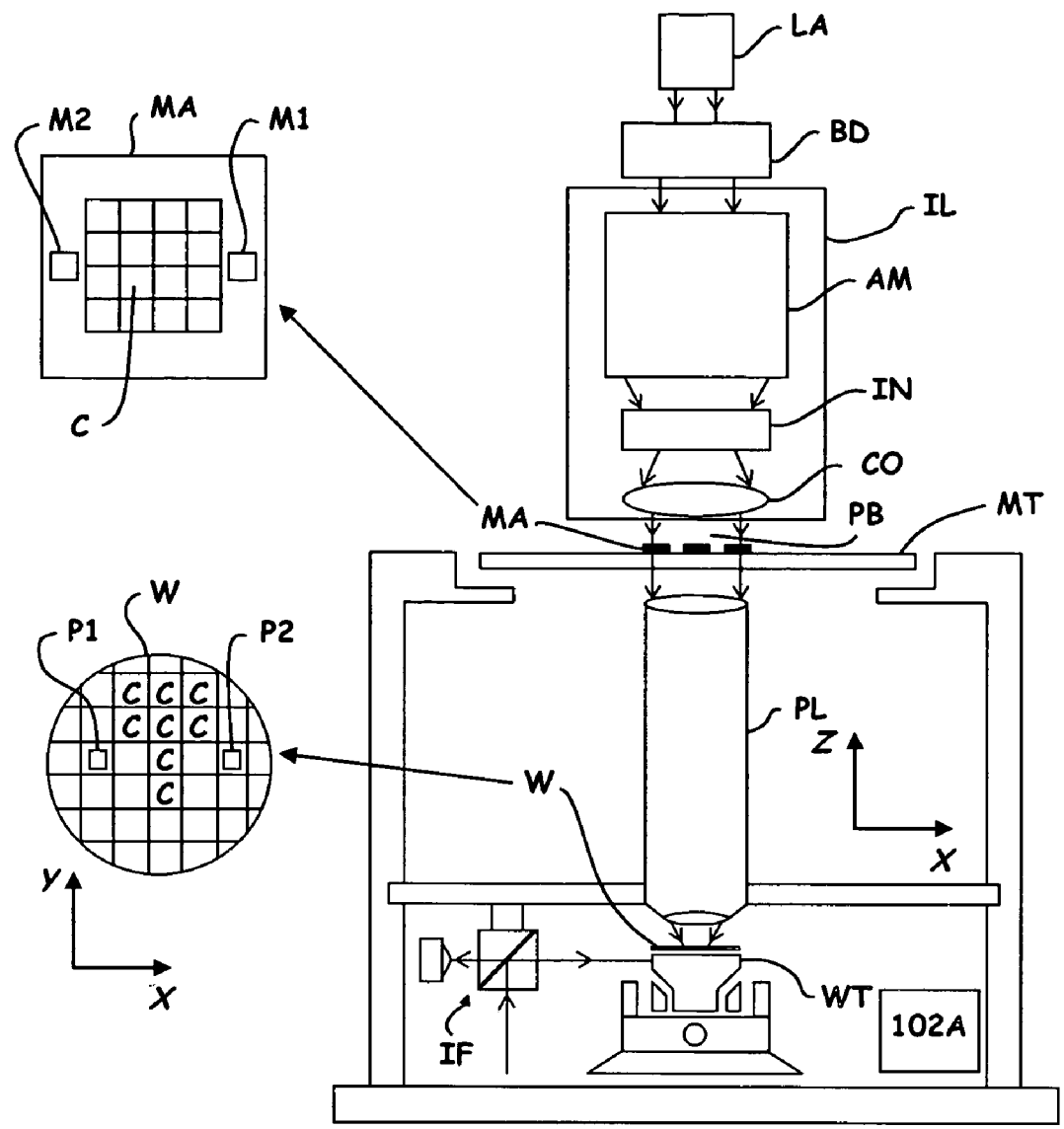
FIG. 2 is a schematic illustration of a photolithographic exposure apparatus.

FIG. 2 provides a more detailed illustration of lithographic apparatus 102. As indicated in FIG. 2, lithographic apparatus 102 includes:

- a radiation system Ex, IL: for supplying a projection beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source LA;
- a first object table (mask table) MT: provided with a mask holder for holding a mask MA (e.g. a reticle), and connected to first positioning mechanism PM for accurately positioning the mask with respect to item PL;
- a second object table (substrate table) WT: provided with a substrate holder for holding a substrate W (e.g. a resist-coated silicon wafer), and connected to second positioning mechanism PW for accurately positioning the substrate with respect to item PL; and
- a projection system ("lens") PL: (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The source LA (e.g. a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Lithographic apparatus 102 may also include an exposure tool controller 102A that controls, monitors, and communicates with the various mechanisms and features of apparatus 102 to properly process and expose the wafer substrate's target portions C. Moreover, exposure tool controller 102A may provide monitoring and feed-forward/feedback control capabilities to manage various operations performed by the exposure tool apparatus 102.

Exposure tool controller 102A may comprise microprocessing circuitry, application-specific integrated circuitry (ASIC), or similar logic circuitry capable of processing information and instructions, responding to information requests, communicating with linked devices, and executing commands. In addition, exposure tool controller 102A may be configured with a communications interface portion to enable communications and control between various controllers and control elements employed by a lithographic system and may also include electronic memory and/or storage facilities.

Returning to FIG. 1, the wafer track apparatus 104 portion of lithographic system 100 interconnects lithographic exposure apparatus 102 with a host of pre-exposure processing modules, which are configured to treat the wafer substrates prior to exposure. These pre-processing modules may include, for example, wafer supply module 106a, resist coating module 106b, priming module 106c, and soft bake module 106d. Additionally, wafer supply module 106a may include a loading station 12 for loading and unloading cassettes containing wafers to be processed.

Similarly, wafer track apparatus 104 interconnects lithographic exposure apparatus 102 with a variety of post-exposure processing modules, which are configured to treat and service the substrate wafers after exposure. These post-exposure processing modules may include, for example, post-exposure bake (PEB) module 108a, hard bake module 108b, chill plate module 108c, and developer module 108d.

A measurement process module 108e may be linked with wafer track apparatus 104 (as depicted in FIG. 1) or may exist as a stand-alone module. Measurement process module 108e may be used to calibrate metrology information. For example, process module 108e may be configured to measure and assess a host of wafer substrate attributes and artifacts that relate to CDU, such as the CD of the entire substrate, the CD of the individual target fields, and various profile dimensions. To this end, measurement process module 108e may comprise a scanning electron microscope (SEM), spectroscopic ellipsometer, reflectometer, electric line width measurement (ELM), focused ion beam (FIB), e-Beam, atomic force microscope (AFM), scatterometer, defect inspection tool, overlay measurement tool, or any other tool suitable for such purposes.

Figure 3A:
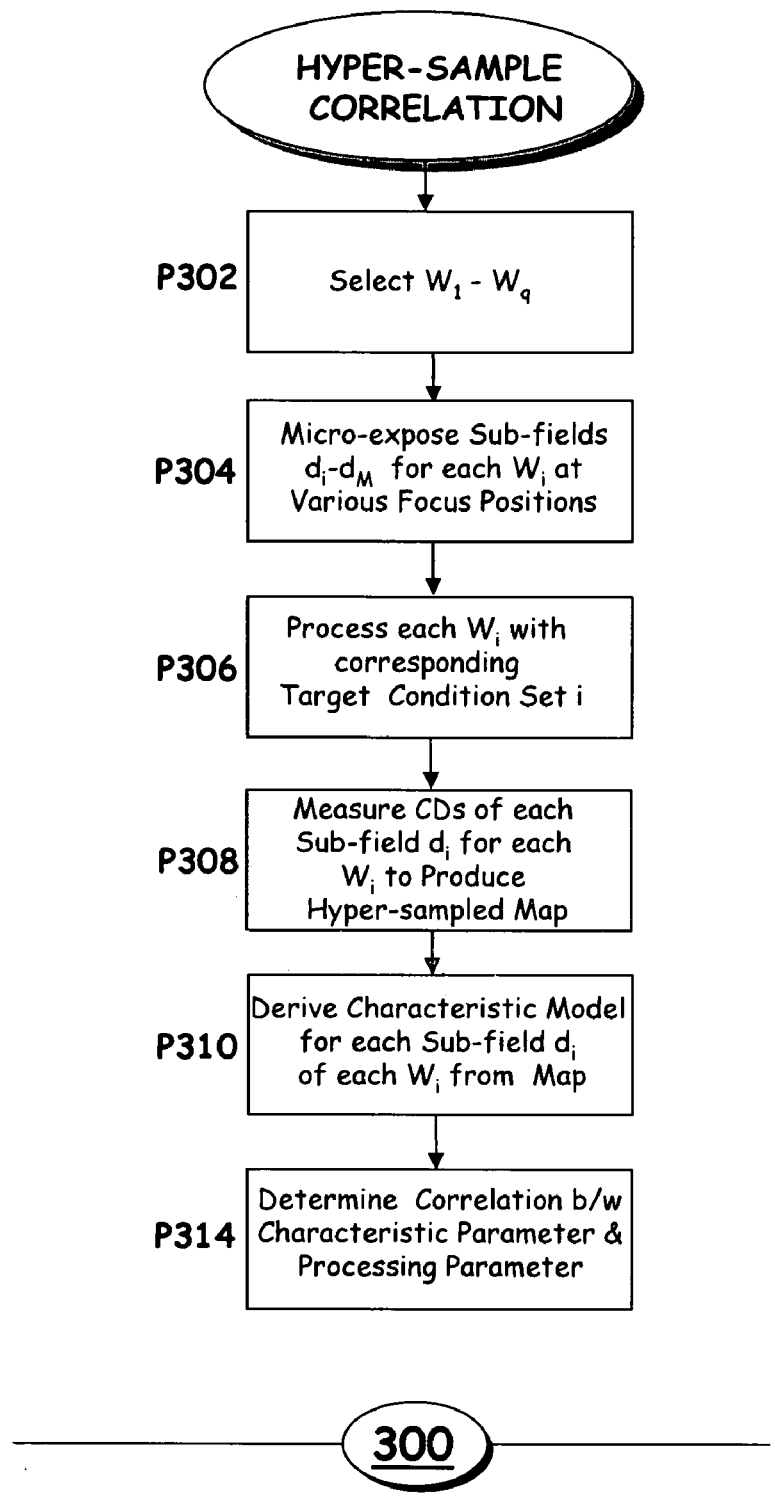
FIG. 3A is a schematic functional flow diagram depicting an embodiment of the present invention.

FIG. 3A depicts adaptive hyper-sample correlation method 300, constructed and operative in accordance with a particular embodiment of the present invention. Correlation method 300 is designed to capture a characteristic that relates to photoresist behavior as a function of lithographic processing conditions. As indicated in FIG. 3A, hyper-sample correlation method 300 commences with procedure task P302 in which multiple wafer substrates $W_1$–$W_q$ are selected. Because correlation method 300 is configured to assess a particular photoresist response under a pre-specified target set of processing conditions, the selected wafer substrates $W_1$–$W_q$ are to have substantially similar photoresist properties and/or photo-resist chemistry as an intended production-level wafer substrate W.

Figure 3B:
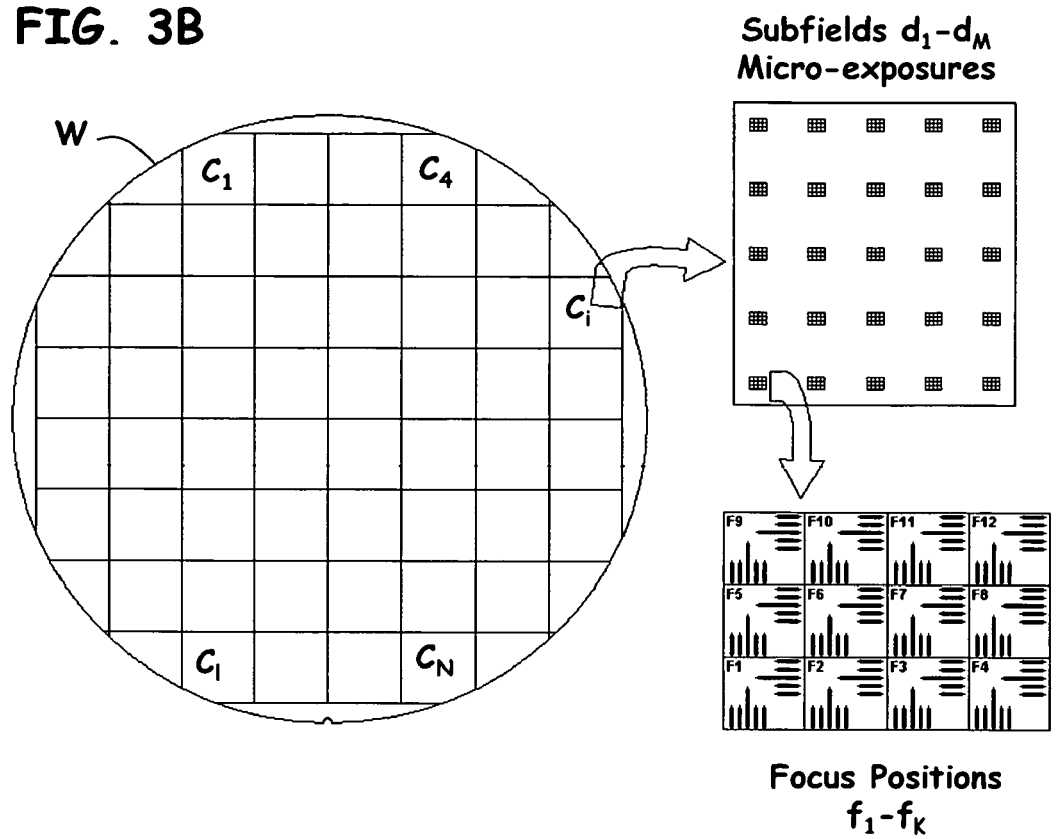

After selecting wafer substrates $W_1$–$W_q$, hyper-sample correlation method 300 advances to procedure task P304, where within each target field $C_i$ of a set of target fields $C_1$–$C_N$ of each wafer substrate $W_i$, a pattern is micro-exposed at various pre-specified focus positions, by lithographic apparatus 102. In one embodiment, as depicted in FIG. 3B, for each of the selected substrate wafers $W_1$–$W_q$, each target field $C_i$ is divided into an array of subfields $d_1$–$d_M$, with each subfield $d_i$ being repeatedly exposed with the same pattern and the same exposure dosage but at different lithographic focus positions $f_1$–$f_K$.

In procedure task P306, each of the micro-exposed wafer substrates $W_1$–$W_q$ are processed in accordance with a pre-specified target processing condition set to determine the photoresist response and sensitivity relative to the targeted processing conditions. It will be appreciated that the pre-specified target processing conditions should include processing conditions that are intended to cover production-level conditions.

Consistent with the illustrative example described above, procedure task P306 may subject wafer substrates $W_1$–$W_q$ to the post-exposure bake PEB process, with the processing parameter of interest being the PEB temperatures. In this case, each of the micro-exposed wafer substrates $W_1$–$W_q$ may be processed by the PEB having the PEB processing condition set at various target temperatures, so that wafer substrate $W_1$ may be baked at a PEB temperature of $°X_1$, wafer substrate $W_2$ may be baked at a PEB temperature of $°X_2$, etc.

In procedure task P308, hyper-sample correlation method 300 measures the CDs of the micro-exposed pattern within each sub-field $d_i$ for each of the wafer substrates $W_1$–$W_q$ to produce hyper-sampled CD measurement map of each wafer substrate $W_1$–$W_q$. This measurement task is configured to measure any combination of features and attributes of the exposed pattern, such as, for example, the size of the individual target fields $C_i$, the gap between features, X and/or Y diameter of holes and/or posts, ellipticity of holes and/or posts, area of features, width at the top of a feature, width at the middle of a feature, width at the bottom of a feature, feature sidewall angle, etc.

Some of these measurements may be performed internally; that is, the features may be measured by employing various mechanisms within lithographic exposure apparatus 102, such as, for example, the combination of alignment sensors and markers. Alternatively, these measurements may be performed by external devices, such as measurement process module 108e, which may take the form of a scanning electron microscope (SEM), spectroscopic ellipsometer, reflectometer, electric line width measurement (ELM), focused ion beam (FIB), e-Beam, atomic force microscope (AFM), scatterometer, defect inspection tool, overlay measurement tool, or any other tool suitable for such purposes.

In procedure task P310, hyper-sample correlation method 300, exploits the hyper-sampled CD measurement map of each wafer substrate $W_1$–$W_q$ to derive a characteristic of the photo-resist response. In a preferred embodiment, the characteristic is based on the Bossung model, which reflects how variations in focus positions $f_1$–$f_K$ and/or exposure dosage affect CDs. The Bossung model is a second order polynomial which, in one embodiment, may take the form of:

$$CD(f_i) = af_i^2 + bf_i + c, \text{ where:}$$

$CD(f_i)$: represents the CDs as a function of focus position $f_i$;

a: represents the curvature of the Bossung model, which is contingent on size and pitch of exposed pattern, numerical aperture NA, and processing conditions;

b: represents the linear portion of the CD response through focus or slope of parabola; and c: represents the CD response at focus set to 0.

Figure 3C:
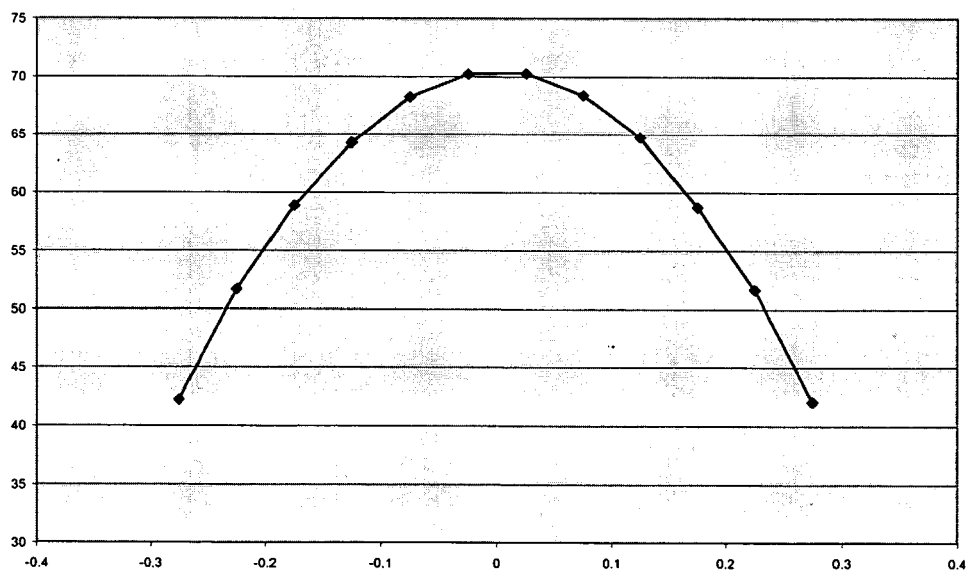

FIG. 3C illustrates one such curve for exposed and processed subfield $d_j$ of target field $C_i$ of wafer substrate $W_i$. The maxima of the curve identifies the optimal focus position $f_o$ for exposed subfield $d_j$ and, as indicated above, the curvature a of the Bossung curve depends on the size and pitch of the exposed pattern, the numerical aperture NA used by the lithographic exposure apparatus 102, and on the processing conditions. Thus, for a specific exposed subfield $d_j$ with the size, pitch, and numerical aperture NA fixed, deviations in Bossung curvature a will reflect variations in the prevailing processing conditions. It will be appreciated that other characteristic models may be used to identify photo-resist response relative to CD.

Regarding the illustrative example described thus far, based on the hyper-sampled CD measurement map, a Bossung curve is plotted for each processed subfield $d_1$–$d_M$ of each wafer substrate $W_1$–$W_q$, indicating how, for each wafer substrate $W_1$–$W_q$, the measured CDs vary as a function of focus position $f_i$.

In procedure task P312, hyper-sample correlation method 300 then determines the correlation information between a characteristic parameter of the model that reflects the photoresist sensitivity and the targeted processing conditions or processing parameter. In one embodiment, the characteristic parameter for each exposed and processed subfield $d_1$–$d_M$ of each wafer substrate $W_1$–$W_q$, is averaged to attain an average characteristic parameter for each wafer substrate $W_1$–$W_q$ processed at the targeted processing parameter. Other embodiments may employ other parametric and/or optimization schemes to achieve such a correlation.

By way of example, consider the use of the Bossung model applied the illustrative example described thus far. For procedure task P312, the characteristic parameter may be configured as the Bossung curvature a, which is capable of reflecting variations in the prevailing processing conditions, and the processing parameter may be configured as the various target PEB temperatures used during the PEB processing, as indicated above. In one embodiment, the Bossung curvatures a that correspond to each processed subfield $d_1$–$d_M$ are averaged for each wafer substrate $W_1$–$W_q$ at the corresponding PEB processing temperature.

FIG. 3D depicts this exemplary correlation between the average Bossung curvatures a and the PEB processing temperatures. Thus, in this example, for a particular photoresist chemistry, a particular PEB temperature will yield a specific average Bossung curvature a.

In this manner, the disclosed correlation process captures a characteristic that relates to photoresist behavior as a function of lithographic processing conditions.

FIG. 3E depicts process optimization method 350, constructed and operative in accordance with a particular embodiment of the present invention. Optimization method 350 contemplates optimizing production-level lithographic processing conditions to achieve substrate uniformity based on the correlation between a characteristic parameter and processing parameter, as discussed above. As indicated in FIG. 3E, process optimization method 300 commences with procedure task P352, which designates the selection of wafer substrate W. Because the correlation is based on a particular photoresist response, selected wafer substrate W is to have substantially similar photoresist properties and/or photo-resist chemistry as the wafer substrates wafer substrates $W_1$–$W_q$ used to determine correlation information.

Process optimization method 350 then advances to procedure task P354, where within each target field $C_i$ of a set of target fields $C_1$–$C_N$ of wafer substrate W, a pattern is micro-exposed at various pre-specified focus positions, by lithographic apparatus 102. In one embodiment, each target field $C_i$ is divided into an array of subfields $d_1$–$d_M$, with each subfield $d_i$ being repeatedly exposed with the same pattern and the same exposure dosage but at different lithographic focus positions $f_1$–$f_K$.

In procedure task P356, the micro-exposed wafer substrate W is processed in accordance with a production-level processing condition set. As noted above, because the pre-specified target processing condition set used in the correlation process should contemplate production level conditions, the production-level processing condition set should fall within the target processing condition set. For example, if the target processing condition set processed prior wafer substrates $W_1$–$W_q$ at a range of PEB temperatures, the production-level conditions should fall within the PEB temperature range.

In procedure task P358, process optimization method 350 measures the CDs of the micro-exposed pattern within each sub-field $d_i$ of wafer substrate W to produce hyper-sampled CD measurement map of the processed wafer substrate W. As discussed above, this measurement task is configured to measure any combination of features and attributes of the exposed pattern, and may be performed internally by the lithographic exposure apparatus 102 or by devices external to lithographic exposure apparatus 102.

In procedure task P360, process optimization method 350 operates on the hyper-sampled CD measurement map of the wafer substrate W to derive a characteristic model of the photo-resist response represented as a function of CD. Although various characteristic models exist, the characteristic model should be substantially similar to the model used in the correlation process.

As noted above, the Bossung model, which was used in the correlation process, may be relied upon to reflect how variations in focus positions $f_1$–$f_K$ and/or exposure dosage affect CDs. Consistent with the illustrative example presented above, procedure task P360 plots a Bossung curve for each processed subfield $d_1$–$d_M$ of the wafer substrate W.

In procedure task P362, process optimization method 350 detects variations in the characteristic model parameters across the processed wafer substrate W. That is, because each of the subfields $d_1$–$d_M$ of wafer substrate W are processed with the same, production-level processing conditions, a subfield $d_i$ having a different characteristic model or parameter than $d_j$ indicates a variation. To continue with the described example, a variation is detected if subfield $d_1$ exhibits a Bossung curvature of $a_1$ while subfield $d_2$ exhibits a Bossung curvature of $a_2$.

In procedure task P364, process optimization method 350 adjusts the processing incurred by wafer substrate W, based on the correlation information, to achieve uniformity across the substrate W. As noted above, the correlation information identifies the relationship between a characteristic parameter indicative of photoresist sensitivity and a range of targeted processing conditions/parameters. So that, for a desired characteristic parameter, the correlation information could be relied upon to extract a processing parameter that corresponds to the desired characteristic parameter. Accordingly, if a subfield $d_i$ or a group of adjacent subfields $d_i$–$d_j$ exhibit a different characteristic parameter than expected then, based on the correlation information, the processing parameter can be adjusted or modified to the value that relates to the expected characteristic parameter.

For example, returning to FIG. 3E, if subfields $d_8$–$d_{10}$ exhibit a Bossung curvature of a=−385, when a Bossung curvature of a=−325 is expected, the thermal zones associated with the local region of the PEB that correspond to subfields $d_8$–$d_{10}$ are adjusted, in accordance with the correlation curve, to increase the PEB zonal temperature to 130° C. and ensure that subfields $d_8$–$d_{10}$ of subsequent wafer substrates will have uniform curvature a across the substrate.

In addition, adjustments to the production-level conditions may further include the spatial alteration of the condition consistent with the detected variations across the substrate W, across the target fields target field $C_i$, or across the sub-fields subfields $d_1$–$d_M$.

In this manner, the disclosed process optimization method enhances production-level lithographic processing conditions to achieve uniform processing, based on the correlation information between a characteristic parameter and processing parameter.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures. For example, some of the disclosed procedure tasks may be performed by the exposure tool controller or, in the alternative, by a processing device dedicated for such purposes.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A method of optimizing lithographic processing to achieve substrate uniformity, comprising:
    deriving correlation information indicative of photoresist behavior, comprising:
        exposing a pattern onto a plurality of subfields of a plurality of substrates such that, for each of said substrates, said subfields are repeatedly exposed with the pattern at different focal positions of a lithographic exposure apparatus,
        processing each of said substrates at different target processing conditions,
        measuring attributes of each of said subfields within each of said processed substrates,
        determining a characteristic for each of said subfields based on said measured attributes, said characteristic representative of photoresist behavior, and
        extracting correlation information regarding said subfield characteristics and said different target processing conditions;
    detecting non-uniformities in a subsequent substrate, comprising:
        exposing said pattern onto a plurality of subfields of said subsequent substrate such that said subfields are repeatedly exposed with the pattern at different focal positions of said lithographic exposure apparatus,
        processing said subsequent substrate at a production processing condition,
        measuring attributes of said subfields within said processed subsequent substrate,
        determining said characteristic for each of said subfields within said processed subsequent substrate based on said measured attributes, and
        identifying differences among said subfield characteristics of said processed subsequent substrate; and
    adjusting said production processing condition based on said correlation information.

2. The method of claim 1, wherein said plurality of substrates and said subsequent substrate comprise substantially similar photo-resist properties.

3. The method of claim 1, wherein said production processing condition is included in said different target processing conditions.

4. The method of claim 1, wherein said extracting correlation information further includes relating, for each of said different target processing conditions, a corresponding characteristic value.

5. The method of claim 4, wherein said adjusting said production processing condition further includes,
    determining an expected characteristic value,
    referring to said correlation information to indicate a corresponding production processing condition, and
    adjusting said processing to achieve said indicated corresponding production processing condition.

6. The method of claim 5, wherein adjusting said processing further includes spatially altering said processing based on said variations across at least one of said processed subsequent substrate and said subfields within said processed subsequent substrate.

7. The method of claim 1, wherein said characteristic is based on Bossung model curvature.

8. The method of claim 7, wherein said different target processing conditions comprises a range of baking temperatures and said production processing condition falls within said range of baking temperatures.

9. The method of claim 8, wherein said correlation information further includes averaging each of said Bossung curvatures for each of said plurality of processed substrates baked at a specified baking temperature to determine baking temperature as a function of curvatures.

10. The method of claim 9, wherein said identifying differences among said subfield characteristics includes determining an Bossung curvature corresponding to a subfield of said processed subsequent substrate that contains a different value than an expected Bossung curvature value.

11. The method of claim 10, wherein said adjusting said processing includes,
    determining an expected characteristic value,
    referring to said correlation information to indicate a corresponding production processing condition, and
    adjusting said processing to achieve said indicated corresponding production processing condition.

12. A method of optimizing uniformity in lithographic processing, comprising:
    exposing repeatedly a pattern at different exposure conditions on a subfield of a substrate with a lithographic projection apparatus,
    processing said substrate at a production processing condition,
    measuring attributes of said subfield of said processed substrate,
    determining a characteristic of said subfield of said processed substrate based on said measured attributes,
    identifying differences between said calculated characteristics;
    determining differences in production processing condition on the basis of said identified differences, and;
    adjusting said production processing condition based on said determined differences.

13. The method of claim 12, wherein the different exposure conditions by which the pattern is exposed includes operating at different focal positions of the lithographic projection apparatus.

14. The method of claim 12, wherein the measuring of attributes is performed by a scanning electron microscope, a spectroscopic ellipsometer, a reflectometer, a scatterometer, an electric linewidth measurement tool, a focused ion beam, an e beam, an atomic force microscope, a defect inspection tool or an overlay measurement tool.

15. The method of claim 12, wherein said production processing condition comprises a post exposure bake.

16. The method of claim 12, wherein said uniformity comprises the uniformity of the critical dimension (CDU).

17. The method of claim 12, wherein said uniformity comprises the uniformity over a substrate.

18. The method of claim 12, wherein said adjusting said production processing condition comprises adjusting the temperature of the post exposure bake.

19. A method of deriving correlation information indicative of photoresist behavior by:
    exposing repeatedly a pattern at different exposure conditions on subfields of a plurality of calibration substrates with a lithographic projection apparatus, processing each of said calibration substrates at different target processing conditions, measuring attributes of said subfields, determining a characteristic for each of said subfields based on said measured attributes, said characteristic representative of photoresist behavior, and extracting correlation information regarding said subfield characteristics and said different target processing conditions.

20. The method of claim 19 further including processing substrates at a production processing condition, wherein said production processing condition is included in said different target processing conditions.

21. The method of claim 19, wherein said different target processing conditions comprises a range of baking temperatures.

22. The method of claim 20, wherein said characteristic is based on Bossung model curvature.

23. A method of optimizing lithographic processing to achieve substrate uniformity, comprising:

deriving correlation information indicative of photoresist behavior by micro-exposing a pattern at different focal positions onto a plurality of subfields within a plurality of substrates, processing each of said substrates at different target processing conditions, measuring attributes of each of said subfields within each of said processed substrates, determining a Bossung curvature characteristic for each of said subfields based on said measured attributes, and correlating each Bossung curvature characteristic to said different target processing conditions;

detecting non-uniformities in a subsequent substrate by micro-exposing said pattern at different focal positions onto a plurality of subfields within said subsequent substrate, processing said subsequent substrate at a production processing condition that is consistent with at least one of said different target processing conditions, measuring attributes of said subfields within said processed subsequent substrate, determining said Bossung curvature characteristic for each of said subfields within said processed subsequent substrate based on said measured attributes, and identifying differences among said subfield characteristics of said processed subsequent substrate; and adjusting said production processing condition based on said correlation information by determining an expected characteristic value Bossung curvature characteristic for each of said subfields within said processed subsequent substrate, referring to said correlation information to indicate a corresponding production processing condition, and adjusting said processing to achieve said indicated corresponding production processing condition.

24. The method of claim 23, wherein said plurality of substrates and said subsequent substrate comprise substantially similar photo-resist properties.

25. The method of claim 23, wherein said different target processing conditions comprises a range of baking temperatures and said production processing condition falls within said range of baking temperatures.

26. The method of claim 25, wherein said correlation information further includes averaging each of said Bossung curvatures for each of said plurality of processed substrates baked at a specified baking temperature to determine baking temperature as a function of curvatures.

27. The method of claim 26, wherein said adjusting said production processing condition includes adjusting local thermal zones of baking plate that correspond to said subfields within said processed subsequent substrate.

* * * * *